United States Patent
Porob et al.

(10) Patent No.: US 9,920,417 B2
(45) Date of Patent: Mar. 20, 2018

(54) ARTICLE AND METHOD OF MAKING THEREOF

(71) Applicant: General Electric Company, Schenectady, NY (US)

(72) Inventors: Digamber Gurudas Porob, Bangalore (IN); Shankar Sivaramakrishnan, Schenectady, NY (US); Venkat Subramaniam Venkataramani, Clifton Park, NY (US); Mohandas Nayak, Bangalore (IN); Gopi Chandran Ramachandran, Bangalore (IN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 46 days.

(21) Appl. No.: 14/524,072

(22) Filed: Oct. 27, 2014

(65) Prior Publication Data

US 2016/0115818 A1    Apr. 28, 2016

(51) Int. Cl.
*F01D 25/00* (2006.01)
*C23C 14/08* (2006.01)
*C23C 14/22* (2006.01)
*C23C 4/12* (2016.01)
*C04B 35/00* (2006.01)
(Continued)

(52) U.S. Cl.
CPC ............. *C23C 14/08* (2013.01); *C04B 35/00* (2013.01); *C23C 4/126* (2016.01); *C23C 4/129* (2016.01); *C23C 4/131* (2016.01); *C23C 4/134* (2016.01); *C23C 14/06* (2013.01); *C23C 28/042* (2013.01); *C23C 28/321* (2013.01);
(Continued)

(58) Field of Classification Search
None
See application file for complete search history.

(56) References Cited

U.S. PATENT DOCUMENTS

| 5,102,836 A | | 4/1992 | Brown et al. | |
|---|---|---|---|---|
| 5,320,909 A | * | 6/1994 | Scharman | ............... C23C 4/02 415/174.4 |

(Continued)

FOREIGN PATENT DOCUMENTS

EP    2202212 A2    6/2010

OTHER PUBLICATIONS

Chakraborty et. al. J. Europ. Ceramic Soc. 25, 2005, 1885-1893.*
(Continued)

*Primary Examiner* — Vera Katz
(74) *Attorney, Agent, or Firm* — John P. Darling

(57) ABSTRACT

An article including a substrate and a plurality of coatings disposed on the substrate is presented. The plurality of coatings includes a thermal barrier coating disposed on the substrate; and a protective coating including a calcium-magnesium-aluminum-silicon-oxide (CMAS)-reactive material disposed on the thermal barrier coating. The CMAS-reactive material includes an NZP-type material. The CMAS-reactive material is present in the plurality of coatings in an effective amount to react with a CMAS composition at an operating temperature of the thermal barrier coating, thereby forming a reaction product having one or both of melting temperature and viscosity greater than that of the CMAS composition. A method of making the article and a related turbine engine component are also presented.

12 Claims, 7 Drawing Sheets

(51) Int. Cl.
    *C23C 14/06*       (2006.01)
    *C23C 28/04*       (2006.01)
    *C23C 28/00*       (2006.01)
    *C23C 4/131*       (2016.01)
    *C23C 4/129*       (2016.01)
    *C23C 4/126*       (2016.01)
    *C23C 4/134*       (2016.01)

(52) U.S. Cl.
    CPC ...... *C23C 28/3215* (2013.01); *C23C 28/3455* (2013.01); *F05D 2300/6111* (2013.01)

(56) References Cited

U.S. PATENT DOCUMENTS

| | | | |
|---|---|---|---|
| 5,871,820 | A | 2/1999 | Hasz et al. |
| 6,117,560 | A | 9/2000 | Maloney |
| 6,177,200 | B1 | 1/2001 | Maloney |
| 6,299,988 | B1 | 10/2001 | Wang et al. |
| 6,485,549 | B1 | 11/2002 | Novak et al. |
| 6,485,848 | B1 | 11/2002 | Wang et al. |
| 6,558,814 | B2 | 5/2003 | Spitsberg et al. |
| 6,610,370 | B2 | 8/2003 | Wang et al. |
| 6,630,200 | B2 | 10/2003 | Wang et al. |
| 6,924,040 | B2 | 8/2005 | Maloney |
| 7,662,489 | B2 | 2/2010 | Litton et al. |
| 7,666,528 | B2 | 2/2010 | Hazel et al. |
| 7,722,959 | B2 | 5/2010 | Schlichting et al. |
| 8,062,759 | B2 | 11/2011 | Fu et al. |
| 8,080,283 | B2 | 12/2011 | Schlichting et al. |
| 8,658,255 | B2 | 2/2014 | Kirby et al. |
| 8,658,291 | B2 | 2/2014 | Kirby et al. |
| 9,133,541 | B2 * | 9/2015 | Lee ............ C04B 41/009 |
| 2002/0025454 | A1 | 2/2002 | Wang et al. |
| 2002/0132720 | A1 * | 9/2002 | Cutler ............ B01D 39/2068 501/103 |
| 2003/0003329 | A1 | 1/2003 | Wang et al. |
| 2003/0027012 | A1 * | 2/2003 | Spitsberg ............ C04B 41/009 428/615 |
| 2005/0129868 | A1 | 6/2005 | Philip et al. |
| 2006/0115661 | A1 | 6/2006 | Hazel et al. |
| 2007/0221132 | A1 | 9/2007 | Chandran et al. |
| 2007/0224451 | A1 | 9/2007 | Chandran et al. |
| 2009/0110953 | A1 * | 4/2009 | Margolies ............ C23C 4/18 428/621 |
| 2009/0178413 | A1 * | 7/2009 | Lee ............ C04B 41/009 60/752 |
| 2010/0008770 | A1 | 1/2010 | Hazel et al. |
| 2014/0272467 | A1 | 9/2014 | Schaeffer et al. |
| 2016/0168684 | A1 * | 6/2016 | Brosnan ............ C23C 4/127 428/305.5 |

OTHER PUBLICATIONS

Chakraborty et.al. Surface & Coatings Tech., 201 2006, 1152-1159.*

Lee et al.,"High-Temperature Chemical Stability of Plasma-Sprayed Ca05Sr05Zr4P6O24 Coatings on Nicalon/SiC Ceramic Matrix Composite and Ni-Based Superalloy Substrates", Journal of the American Ceramic Society,Wiley Online Library,Oct. 1996, vol. 79, Issue 10, pp. 2759-2762.

Vaubert et al.,"Development of slurry-based Ca0.5Sr0.5Zr4(PO4)6 (CS-50) coatings for SiC in fossil energy applications", Materials at high temperatures is journal of the month, Maney Online,1999,vol. 16 Issue 4, pp. 175-180.

* cited by examiner

ARTICLE AND METHOD OF MAKING THEREOF

BACKGROUND OF THE INVENTION

The invention relates generally to articles including protective coatings for thermal barrier coatings. More particularly, the invention relates to articles including protective coatings for thermal barrier coatings, such that the protective coatings are calcium-magnesium-aluminum-silicon-oxide (CMAS)-reactive.

Thermal barrier coatings are typically used in articles that operate at or are exposed to high temperatures. Aviation turbines and land-based turbines, for example, may include one or more components protected by the thermal barrier coatings. Under normal conditions of operation, thermal-barrier coated components may be susceptible to various types of damage, including erosion, oxidation, and attack from environmental contaminants.

For turbine components, environmental contaminant compositions of particular concern are those containing oxides of calcium, magnesium, aluminum, silicon, and mixtures thereof. These oxides combine to form contaminant compositions comprising mixed calcium-magnesium-aluminum-silicon-oxide systems (Ca—Mg—Al—SiO), hereafter referred to as "CMAS." At the high turbine operating temperatures, these environmental contaminants can adhere to the heated or hot thermal barrier coating surface, and thus cause damage to the thermal barrier coating. For example, CMAS can form compositions that are liquid or molten at the operating temperatures of the turbines. The molten CMAS composition can dissolve the thermal barrier coating, or can infiltrate its porous structure by infiltrating the pores, channels or other cavities in the coating. Upon cooling, the infiltrated CMAS composition solidifies and reduces the coating strain tolerance, thus initiating and propagating cracks that may cause delamination and spalling of the coating material. This may further result in partial or complete loss of the thermal protection provided to the underlying metal substrate of the part or component. Further, spallation of the thermal barrier coating may create hot spots in the metal substrate leading to premature component failure. Premature component failure can lead to unscheduled maintenance as well as parts replacement resulting in reduced performance, and increased operating and servicing costs.

Thus, there is a need for improved coating systems that provide protection to thermal barrier coatings from the adverse effects of environmental contaminants, when operated at or exposed to high temperatures. In particular, there is a need for improved coating systems that provide protection to thermal barrier coatings from the adverse effects of deposited CMAS.

BRIEF DESCRIPTION OF THE INVENTION

One embodiment is directed to an article including a substrate and a plurality of coatings disposed on the substrate. The plurality of coatings includes a thermal barrier coating disposed on the substrate; and a protective coating including a calcium-magnesium-aluminum-silicon-oxide (CMAS)-reactive material disposed on the thermal barrier coating. The CMAS-reactive material includes an NZP-type material. The CMAS-reactive material is present in the plurality of coatings in an effective amount to react with a CMAS composition at an operating temperature of the thermal barrier coating, thereby forming a reaction product having one or both of melting temperature and viscosity greater than that of the CMAS composition.

Another embodiment of the invention is directed to turbine engine component including a plurality of coatings disposed on a superalloy substrate. The plurality of coatings includes a thermal barrier coating disposed on the superalloy substrate; and a protective coating including a calcium-magnesium-aluminum-silicon-oxide (CMAS)-reactive material disposed on the thermal barrier coating. The CMAS-reactive material includes $Ca_xSr_{1-x}Zr_4(PO_4)_6$, wherein x is a number from 0 to 1. The CMAS-reactive material is present in the plurality of coatings in an effective amount to react with a CMAS composition at an operating temperature of the thermal barrier coating, thereby forming a reaction product having one or both of melting temperature and viscosity greater than that of the CMAS composition.

Another embodiment of the invention is directed to a method of manufacturing an article. The method includes forming a plurality of coatings by disposing a thermal barrier coating on a substrate; and disposing a protective coating including a calcium-magnesium-aluminum-silicon-oxide (CMAS)-reactive material on the thermal barrier coating. The CMAS-reactive material includes an NZP-type material. The CMAS-reactive material is present in the plurality of coatings in an effective amount to react with a CMAS composition at an operating temperature of the thermal barrier coating, thereby forming a reaction product having one or both of melting temperature and viscosity greater than that of the CMAS composition.

DRAWINGS

These and other features, aspects, and advantages of the present invention will become better understood when the following detailed description is read with reference to the accompanying drawings, in which like characters represent like parts throughout the drawings, wherein.

DETAILED DESCRIPTION

Figure 1:
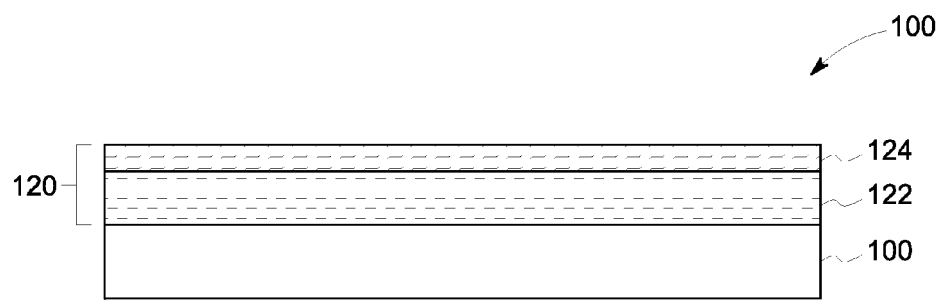
FIG. 1 illustrates a schematic of an article in accordance with an embodiment of the invention.

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable.

As used herein, the term "coating" refers to a material disposed on at least a portion of an underlying surface in a continuous or discontinuous manner. Further, the term "coating" does not necessarily mean a uniform thickness of the disposed material, and the disposed material may have a uniform or a variable thickness. The term "coating" may refer to a single layer of the coating material or may refer to a plurality of layers of the coating material. The coating material may be the same or different in the plurality of layers.

As used herein, the term "disposed on" refers to layers or coatings disposed directly in contact with each other or indirectly by having intervening layers there between, unless otherwise specifically indicated. The term "adjacent" as used herein means that the two layers or coatings are disposed contiguously and are in direct contact with each other.

As mentioned earlier, thermal barrier coatings are susceptible to molten CMAS compositions at high turbine operating temperatures. The molten CMAS composition can dissolve the thermal barrier coating, or can infiltrate its porous structure by infiltrating the pores, channels or other cavities in the coating. Upon cooling, the infiltrated CMAS composition solidifies and reduces the coating strain tolerance, thus initiating and propagating cracks that may cause delamination and spalling of the coating material. Previous methods to protect the thermal barrier coatings include use of CMAS-reactive or CMAS-resistant thermal barrier coating compositions. However, the previously known CMAS-reactive compositions may not provide the desired CMAS-reactivity.

Embodiments of the invention described herein address the noted shortcomings of the state of the art. Some embodiments present an article including a substrate and a plurality of coatings disposed on the substrate. The plurality of coatings includes a thermal barrier coating disposed on the substrate; and a protective coating including a calcium-magnesium-aluminum-silicon-oxide (CMAS)-reactive material disposed on the thermal barrier coating. The CMAS-reactive material includes an NZP-type material. The CMAS-reactive material is present in the plurality of coatings in an effective amount to react with a CMAS composition at an operating temperature of the thermal barrier coating, thereby forming a reaction product having one or both of melting temperature and viscosity greater than that of the CMAS composition.

In accordance with some of the embodiments of the invention, the protective coating may protect the thermal barrier coating by undergoing one or both of chemical and physical changes when in contact with a CMAS composition. The protective coating may be disposed on the thermal barrier coating such that the protective coating overlies the thermal barrier coating. In certain embodiments, the overlay protective coating is disposed adjacent to the thermal barrier coating.

The term "CMAS" or "CMAS composition" as used herein refers to a contaminant composition including calcium, magnesium, aluminum and silicon. In some embodiments, the CMAS composition primarily includes a mixture of magnesium oxide, calcium oxide, aluminum oxide and silicon oxide. Non-limiting example of a suitable CMAS composition includes calcium oxide present in an amount in a range from about 1 wt % to about 60 wt % of the total CMAS composition; magnesium oxide present in an amount in a range from about 0 wt % to about 20 wt % of the total CMAS composition; aluminum oxide present in an amount in a range from about 10 wt % to about 30 wt % of the total CMAS composition; and silicon oxide present in an amount in a range from about 20 wt % to about 80 wt % of the total CMAS composition.

In some embodiments, other elements, such as nickel, iron, titanium and chromium, may also be present in the CMAS composition. In such instances, the additional elements may be present in a small amount, for example, less than about 10 weight percent of total amount of CMAS composition present. In some such instances, the CMAS composition may include about 29 wt % calcium oxide, about 7 wt % magnesium oxide, about 11 wt % aluminum oxide, and about 43 wt % silicon oxide. Further, the composition may include about 2 wt % nickel oxide, about 8 wt % iron oxide, and small amounts of titanium oxide and chromium oxide, such that the total weight percentage of these elements is less than 10 wt %. The CMAS composition may have a melting temperature less than about 1315° C. (2399° F.) in some embodiments, and less than about 1227° C. (2240° F.) in some other embodiments.

The particular compositional characteristics of the CMAS composition may depend on the source of the environmental contaminants and the reaction temperature. The CMAS composition is typically formed at operational temperatures of about 1000° C. (1832° F.) or more. Sources of CMAS composition include, but are not limited to, sand, dirt, volcanic ash, fly ash, cement, runway dirt, fuel and air sources, oxidation and wear products from engine components, or combinations thereof.

As used herein, the term "CMAS-reactive material" refers to a material capable of reacting with a CMAS composition to form a reaction product having one or both of melting temperature and viscosity greater than that of the CMAS composition. In some instances, the reaction product may form a glassy (typically thin) protective layer that the CMAS deposits are either unable to adhere to, or are less able to adhere to.

In accordance with embodiments of the invention, a suitable CMAS-reactive material includes an NZP-type material. The term "NZP-type material" as used herein refers to a family of materials having a structure similar to $NaZr_2P_3O_{12}$ (the parent compound from which the name is derived). The NZP materials typically have a 3D 'open' framework structure with $ZrO_6$ octahedra linked to $PO_4$ tetrahedra. In some embodiments, the NZP-type material may have a hexagonal structure.

Typically, the NZP-type materials have been used as thermal barrier coatings as their expansion coefficient can be tailored to match that of the substrate. In contrast, in accordance with embodiments of the invention, the NZP-type materials are instead used as an additional coating overlying the thermal barrier coating thereby providing protection to the thermal barrier coatings from CMAS deposits. Without being bound by any theory it is believed that the NZP-type materials because of their inherently open structure may react with the CMAS composition such that the kinetics of reaction of the NZP-type material with the CMAS competes with the infiltration of liquid CMAS into the pores of the thermal barrier coating. Accordingly, further penetration of the molten CMAS composition through the pores of the thermal barrier coatings may be avoided. Further, the NZP-type materials may form substantially stable solid reaction products when in contact with molten CMAS composition. The formation of the solid product phase may plug the vertical cracks in the thermal barrier coatings, and also increase the viscosity of the CMAS composition, thereby avoiding its infiltration, and thus extending the life of the thermal barrier coating layer.

In some embodiments, the CMAS-reactive material includes a material having formula (I):

$$A_{1-x}B_xZr_{4-y}D_y(PO_4)_z \quad (I)$$

wherein A and B are selected from the group consisting of alkaline earth metals and rare earth metals, D is hafnium or titanium; x is a number from 0 to 1; y is a number from 0 to 4; and z is 3 or 6. Non-limiting examples of suitable alkaline earth metals include beryllium, magnesium, calcium, strontium, barium, or combinations thereof. Non-limiting examples of suitable rare earth metals include scandium, yttrium, lanthanum, cerium, gadolinium, praseodymium, neodymium, promethium, samarium, europium, terbium, dysprosium, holmium, erbium, thulium, ytterbium, lutetium, or combinations thereof.

In some embodiments, the CMAS-reactive material includes $MZr_4(PO_4)_6$, wherein M includes at least one alkaline earth metal. As noted earlier, M may include beryllium, magnesium, calcium, strontium, barium, or combinations thereof. In certain embodiments, the CMAS-reactive material includes $Ca_xSr_{1-x}Zr_4(PO_4)_6$, wherein x is a number from 0 to 1. In certain embodiments, the CMAS-reactive material includes $CaZr_4(PO_4)_6$, $SrZr_4(PO_4)_6$, $Ca_{0.5}Sr_{0.5}Zr_4(PO_4)_6$, or combinations thereof.

As noted earlier, the CMAS-reactive material is present in the protective coating in an effective amount to react with the CMAS composition at an operating temperature of the thermal barrier coating, thereby forming a reaction product having one or both of melting temperature and viscosity greater than that of the CMAS composition.

The term "effective amount" as used herein refers to an amount (for example, volume) of the CMAS-reactive material sufficient to effectively increase one or both of the melting temperature and viscosity of the reaction product formed.

The term "operating temperature" of the thermal barrier coating refers to the temperature that the thermal barrier coating is exposed to in the turbine. In some embodiments, the operating temperature of the thermal barrier coating refers to the surface temperature of the thermal barrier coating. The term "reaction product" as used herein refers to a product or a mixture of products formed by reacting the CMAS-reactive material with the CMAS composition. In certain embodiments, the reaction product may include a mixture of products. Accordingly the terms "reaction product" and "reaction product mixture" are used herein interchangeably. In some such instances, one or more products in the reaction product mixture may include new crystal phases that have a melting temperature greater than that of the CMAS composition. Further, in some such instances, the reaction product mixture may have a viscosity greater than that of the CMAS composition.

In some embodiments, the CMAS-reactive material is present in the plurality of coatings in an amount such that the melting temperature of the reaction product is increased at least to the surface temperature of the thermal barrier coating. In some embodiments, the CMAS-reactive material is present in the plurality of coatings in an amount such that the melting temperature of the reaction product increases by at least about 10° C. above the surface temperature of the thermal barrier coating during its operation. In some embodiments, the CMAS-reactive material is present in the plurality of coatings in an amount such that the melting temperature of the reaction product increases by about 40° C. to about 100° C. above the surface temperature of the thermal barrier coating during its operation. Thus, by way of an example, if the surface temperature of the thermal barrier coating during operation is about 1230° C., then the CMAS-reactive material is present in amount such that the melting temperature of the reaction product increases to at least about 1240° C.

In some embodiments, the CMAS-reactive material is present in the plurality of coatings in an amount such that the viscosity of the reaction product increases by at least about 10 centipoise above the viscosity of the CMAS composition, at the operating temperature of the thermal barrier coating. In some embodiments, the CMAS-reactive material is present in the plurality of coatings in an amount such that the viscosity of the reaction product increases by about 10 centipoise to about 1000000 centipoise above the viscosity of the CMAS composition, at the operating temperature of the thermal barrier coating.

In some embodiments, the CMAS-reactive material is present in the plurality of coatings in an amount in a range from about 10 volume percent to about 75 volume percent. In some embodiments, the CMAS-reactive material is present in the plurality of coatings in an amount in a range from about 10 volume percent to about 50 volume percent. In some embodiments, the CMAS-reactive material is present in the plurality of coatings in an amount in a range from about 10 volume percent to about 25 volume percent.

The protective coating may be further characterized by the thickness, and may have a thickness such that the effective amount of the CMAS-reactive material is present in the plurality of coatings. In some embodiments, the protective coating has a thickness in a range from about 25 microns to about 1000 microns. In some embodiments, the protective coating has a thickness in a range from about 50 microns to about 500 microns. In some embodiments, the protective coating has a thickness in a range from about 50 microns to about 100 microns.

The protective coating may include the CMAS-reactive material in an amount of up to 100 wt %, and sufficient to protect the thermal barrier coating at least partially against deposited CMAS. The protective coating may further include additional materials (for example, a ceramic thermal barrier coating material) to render the protective coating more compatible (for example, CTE matching) with the thermal barrier coating. In some embodiments, the protective coating includes from about 20 wt % to about 100 wt % CMAS-reactive material and from about 0 wt % to about 80 wt % ceramic thermal barrier coating material. In some embodiments, the protective coating includes from about 40 wt % to about 60 wt % CMAS-reactive material and from about 40 wt % to about 60 wt % ceramic thermal barrier coating material.

As used herein, the term "thermal barrier coating" refers to a coating include a material capable of reducing heat flow to the underlying substrate of the article, that is, forming a thermal barrier. In some embodiments, the thermal barrier coating includes a material having a melting point greater than about 1090° C. In some embodiments, the thermal barrier coating includes a material having a melting point greater than about 1200° C. In some embodiments, the thermal barrier coating includes a material having a melting point in a range from about 1200° C. to about 1930° C.

In some embodiments, the thermal barrier coating includes a ceramic thermal barrier material. Suitable ceramic thermal barrier coating materials include various zirconias, in particular chemically stabilized zirconias (for example, metal oxides blended with zirconia), such as yttria-stabilized zirconias, ceria-stabilized zirconias, calcia-stabilized zirconias, scandia-stabilized zirconias, magnesia-stabilized zirconias, india-stabilized zirconias, ytterbia-stabilized zirconias, lanthana-stabilized zirconias, gadolinia-stabilized zirconias, as well as mixtures of such stabilized zirconias.

In certain embodiments, the thermal barrier coating includes yttria-stabilized zirconias. Suitable yttria-stabilized zirconias may include from about 1 wt % to about 20 wt % yttria (based on the combined weight of yttria and zirconia), and more typically from about 3 wt % to about 10 wt % yttria. An example yttria-stabilized zirconia thermal barrier coating includes about 7% yttria and about 93% zirconia. These chemically stabilized zirconias may further include one or more of a second metal (e.g., a lanthanide or actinide) oxide such as dysprosia, erbia, europia, gadolinia, neodymia, praseodymia, urania, and hafnia to further reduce thermal conductivity of the thermal barrier coating. In some embodiments, the thermal barrier coating may further include an additional metal oxide, such as, titania.

Suitable ceramic thermal barrier coating materials may also include pyrochlores of general formula $A_2B_2O_7$ where A is a metal having a valence of 3+ or 2+ (e.g., gadolinium, aluminum, cerium, lanthanum or yttrium) and B is a metal having a valence of 4+ or 5+ (e.g., hafnium, titanium, cerium or zirconium) where the sum of the A and B valences is 7. Representative materials of this type include gadolinium-zirconate, lanthanum titanate, lanthanum zirconate, yttrium zirconate, lanthanum hafnate, cerium zirconate, aluminum cerate, cerium hafnate, aluminum hafnate and lanthanum cerate.

The thermal barrier coating may include the ceramic thermal barrier coating material in an amount of up to 100 wt %. In some embodiments, the thermal barrier coatings includes the ceramic thermal barrier coating material in a range from about 95 wt % to about 100 wt % and more particularly from about 98 wt % to about 100 wt %. The composition of the thermal barrier coating in terms of the type and amount of the ceramic thermal barrier coating materials may depend upon one or factors, including the composition of the adjacent bond coat layer (if present), the coefficient of thermal expansion (CTE) characteristics desired for the thermal barrier coating, and the thermal barrier properties desired for the thermal barrier coating.

The thickness of the thermal barrier coating may depend upon the substrate or the component it is deposited on. In some embodiments, the thermal barrier coating has a thickness in a range from about 50% to about 90% of the total thickness of the plurality of layers. In some embodiments, the thermal barrier coating has a thickness in a range of from about 25 microns to about 2000 microns. In some embodiments, the thermal barrier coating has a thickness in a range of from about 25 microns to about 1500 microns. In some embodiments, the thermal barrier coating has a thickness in a range of from about 25 microns to about 1000 microns.

As noted earlier, the thermal barrier coatings typically include pores, channels or other cavities that may be infiltrated by molten environmental contaminants, such as, CMAS. In some instances, these pores, channels, or cavities may be created by environmental damage or the normal wear and tear during operation of the thermal barrier coatings. In some instances, the pores, channels or other cavities in the thermal barrier coating surface may result due to the deposition processes. For example, thermal barrier coatings that are deposited by (air) plasma spray techniques may result in a sponge-like porous structure of open pores in at least the surface of the coating. Similarly, thermal barrier coatings that are deposited by physical (e.g., chemical) vapor deposition techniques may result in a porous structure including a series of columnar grooves, crevices or channels in at least the surface of the coating. Without being bound by any theory it is believed that the porous structure may be one of the factors that provides for strain tolerance by the thermal barrier coatings during thermal cycling. Further, the porous structure may further provide for stress reduction due to the differences between the coefficient of thermal expansion (CTE) of the coating and the CTE of the underlying bond coat layer/substrate.

Thermal barrier coating may be disposed over the aforementioned bond coat or directly onto the substrate depending upon the desired application. The type of substrate may depend in on part on the turbine component. Non-limiting examples of suitable substrates include metals, metal alloys, or combinations thereof. In certain embodiments, the substrate includes an alloy of nickel, cobalt, iron, or combinations thereof. For example, the substrate may include a high temperature, heat-resistant alloy, e.g., a superalloy. Non-limiting examples of suitable high temperature nickel-based alloys include Inconel®, Nimonic®, Rene® (e.g., Rene® 80, Rene® 95 alloys), Udimet®, or combinations thereof.

The article may further include a bond coating disposed between the substrate and the thermal barrier coating. The bond coating may be formed from a metallic oxidation-resistant material that protects the underlying substrate and enables the thermal barrier coating to more tenaciously adhere to substrate. Suitable materials for the bond coating include $M_1CrAlY$ alloy powders, where $M_1$ represents a metal such as iron, nickel, platinum or cobalt. Non-limiting examples of suitable bond coat materials include metal aluminides such as nickel aluminide, platinum aluminide, or combinations thereof. The bond coating may have a thickness in the range of from about 25 microns to about 500 microns.

In some embodiments, the protective coating may be the outermost layer (sometimes also referred to as "top coat layer") in the article. In some other embodiments, the article may further include one or more additional layers disposed on the protective coating to form the top coat layer. Non-limiting examples of suitable top-coat layers include erosion resistant layers.

Referring now to FIG. 1, an article 100 includes a substrate 110 and a plurality of coatings 120 disposed on the substrate 110. The plurality of coatings include a thermal barrier coating 122 disposed on the substrate 110, and a protective coating 124 disposed on the thermal barrier coating 122. In the embodiment illustrated in FIG. 1, the protective coating 124 overlies and is disposed adjacent to the thermal barrier coating.

Figure 2:
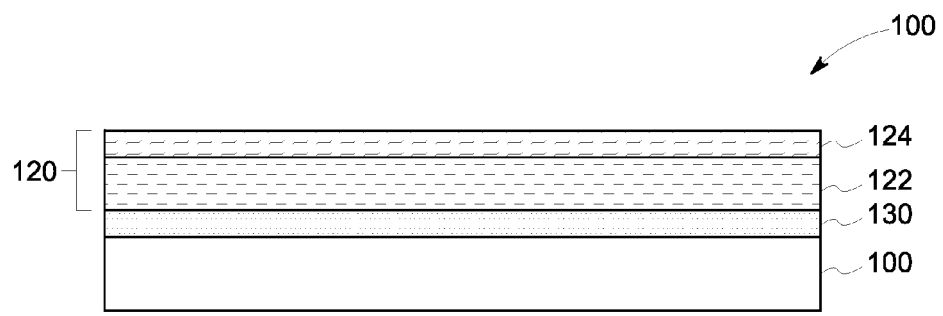
FIG. 2 illustrates a schematic of an article in accordance with an embodiment of the invention.

FIG. 2 illustrates another embodiment of the invention similar to FIG. 1, with the addition of a bond coating 130 disposed between the substrate 110 and the thermal barrier coating 122. In the embodiment illustrated in FIG. 2, the thermal barrier coating 122 overlies and is disposed adjacent to the bond coating 130.

Figure 3:
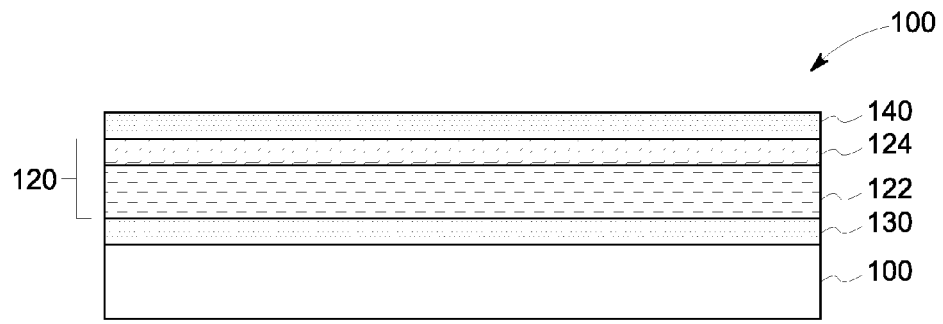
FIG. 3 illustrates a schematic of an article in accordance with an embodiment of the invention.

FIG. 3 illustrates another embodiment of the invention similar to FIG. 3, with the addition of a top-coat layer 140 disposed on the protective coating 124. As mentioned previously the top-coat layer 140 may include an erosion resistance material in some embodiments.

The coating systems of the present invention may be useful in a wide variety of turbine components (e.g., turbine engine components) that are operated at, or exposed to, high temperatures. Non-limiting examples of suitable turbine engine components include turbine airfoils such as blades and vanes, turbine shrouds, turbine nozzles, buckets, combustor components such as liners and deflectors, heat shields, augmentor hardware of gas turbine engines, and the like. The coatings systems of the present invention may be disposed over a portion or over all of the metal substrate. For example, with regard to airfoils such as blades, the coating systems of the present invention are typically used to protect, cover or overlay portions of the metal substrate of the airfoil other than solely the tip thereof, for example, the thermal barrier coatings cover the leading and trailing edges and other surfaces of the airfoil.

In some embodiments, a turbine engine component is also presented. The turbine engine component includes a thermal barrier coating disposed on a superalloy substrate; a protective coating including a calcium-magnesium-aluminum-silicon-oxide (CMAS)-reactive material disposed on the thermal barrier coating. The CMAS-reactive material includes $Ca_xSr_{1-x}Zr_4(PO_4)_6$, wherein x is a number from 0 to 1, and the CMAS-reactive material is present in the protective coating in an effective amount to react with a CMAS composition at an operating temperature of the thermal barrier coating, thereby forming a reaction product having one or both of melting temperature and viscosity greater than that of the CMAS composition.

In some embodiments, a method of manufacturing an article is presented. The method includes disposing a thermal barrier coating on a substrate; and disposing a protective coating including a calcium-magnesium-aluminum-silicon-oxide (CMAS)-reactive material on the thermal barrier coating. As mentioned earlier, the CMAS-reactive material includes an NZP-type material, and the CMAS-reactive material is present in the protective coating in an effective amount to react with a CMAS composition at an operating temperature of the thermal barrier coating, thereby forming a reaction product having one or both of melting temperature and viscosity greater than that of the CMAS composition.

The thermal barrier coating may be deposited or otherwise formed on a bond coating (if present) or on the substrate directly by any of a variety of conventional techniques, including vapor disposition, such as physical vapor deposition (PVD), electron beam physical vapor deposition (EBPVD); plasma spray, such as air plasma spray (APS), suspension plasma spray (SPS), and vacuum plasma spray (VPS); other thermal spray deposition methods such as high velocity oxy-fuel (HVOF) spray, detonation, or wire spray; chemical vapor deposition (CVD), sol-gel method, or combinations of two or more of the afore-mentioned techniques The particular technique used for applying, depositing or otherwise forming the thermal barrier coating may depend on one or more of the composition of the thermal barrier coating, the thickness, and the physical structure desired for the thermal barrier coating. In certain embodiments, the thermal barrier coating is disposed on the substrate using plasma spray techniques. Various types of plasma-spray techniques are well known to those skilled in the art, and may be utilized to dispose the thermal barrier coatings of the present invention.

In some embodiments, the thermal barrier coating may be disposed on the bond coating. In such instances, the bond coating may be applied, deposited or otherwise formed on the substrate by any of a variety of conventional techniques including, vapor disposition, such as physical vapor deposition (PVD), electron beam physical vapor deposition (EBPVD); plasma spray, such as air plasma spray (APS) and vacuum plasma spray (VPS); other thermal spray deposition methods such as high velocity oxy-fuel (HVOF) spray, detonation, or wire spray; chemical vapor deposition (CVD), sol-gel method, or combinations of two or more of the afore-mentioned techniques. In some embodiments, a plasma spray technique, such as that used for the thermal barrier coating, may be employed to dispose the bond coating on the substrate.

The method further includes disposing the protective coating on the thermal barrier coating. In embodiments wherein the protective coatings primarily comprises of the CMAS-reactive material, the CMAS-reactive materials may be applied, deposited or formed on the thermal barrier coating using one or more of the afore-mentioned techniques used to dispose the thermal barrier coating. In embodiments, wherein the protective coating further includes a ceramic thermal barrier material, the CMAS-reactive material and the ceramic thermal barrier material may be co-deposited on the thermal barrier coating. In some embodiments, co-depositing may be achieved by blending, mixing or otherwise combining the CMAS-reactive material and ceramic thermal barrier coating material together (for example, as powders) to provide a mixture that is then deposited onto the thermal barrier coating. In some embodiments, co-depositing may be achieved by separately depositing onto the thermal barrier coating (e.g., as separate plasma spray streams) the respective CMAS-reactive material and ceramic thermal barrier coating material in a manner such that these materials blend, mix or otherwise combine together to form a mixture.

The method of the present invention is particularly useful in providing protection or mitigation against the adverse effects of environmental contaminant compositions for TBCs used with metal substrates of newly manufactured articles. However, the method of the present invention is also useful in providing such protection or mitigation against the adverse effects of environmental contaminant compositions for refurbished worn or damaged TBCs, or in providing TBCs having such protection or mitigation for articles that did not originally have a TBC.

According to embodiments of the invention, the thermal barrier coatings are provided with at least partial and up to complete protection and mitigation against the adverse effects of environmental contaminant compositions that can deposit on the surface of such coatings during normal turbine operation. In particular, the thermal barrier coatings of the present invention are provided with at least partial and up to complete protection or mitigation against the adverse effects of CMAS deposits on such coating surfaces. The CMAS-reactive material present in the protective coating reacts with the CMAS deposits to form a reaction product having a higher melting point that does not become molten, or alternatively has a viscosity such the molten reaction product does not flow readily at higher temperatures normally encountered during turbine engine operation. In some instances, this combined reaction product may form a glassy (typically thin) protective layer that CMAS deposits are unable or less able to adhere to. As a result, these CMAS deposits may be unable to infiltrate the normally porous surface structure of the thermal barrier coating, and thus may not cause undesired partial (or complete) delamination and spalling of the coating.

The coating systems of the present invention are also useful with worn or damaged coated (or uncoated) metal substrates of turbine engine parts and components so as to provide for these refurbished parts and components protection and mitigation against the adverse effects of environmental contaminant compositions. In addition to turbine engine parts and components, the coating system of the present invention provide useful protection for metal substrates of other articles that operate at, or are exposed, to high temperatures, as well as to environmental contaminant compositions.

EXAMPLES

Synthesis of NZP-type materials: Three different NZP-type compositions: $CaZr_4(PO_4)_6$ (CZP), $Ca_{0.5}Sr_{0.5}Zr_4(PO_4)_6$ (CSZP), and $SrZr_4(PO_4)_6$ (SZP) were synthesized. For example, CSZP was formed by firing a powder mixture of $CaCO_3$, $SrCO_3$, $ZrO_2$, and $(NH_4)_2HPO_4$ at 600° C. for 4 hours followed by second firing at 1300° C. for 6 hours. A single phase material was obtained as evidenced by powder X-ray diffraction (PXRD).

Example 1 Reaction of CMAS with NZP-type Materials

Figure 4:
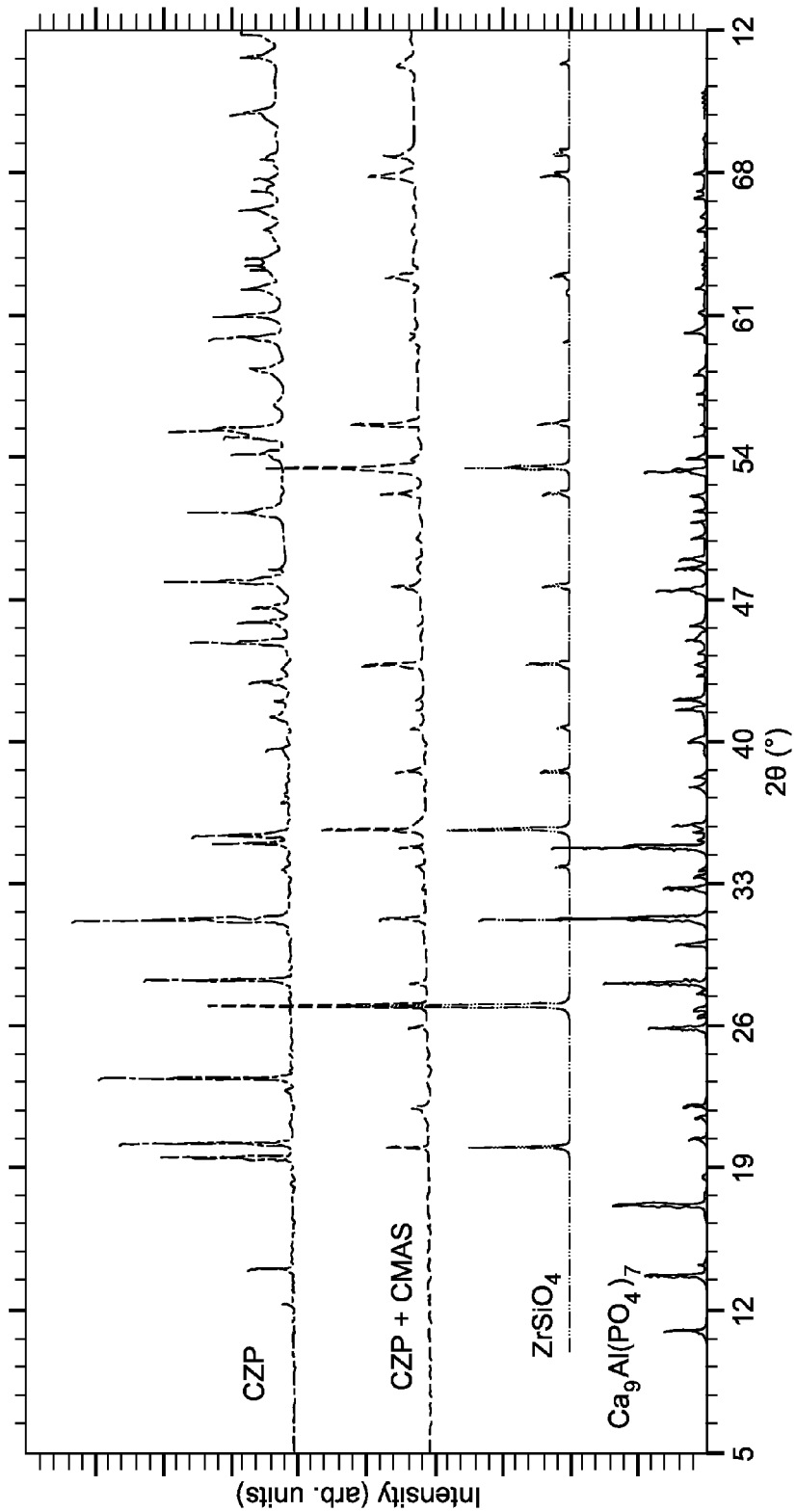
FIG. 4 shows the powder X-ray diffraction pattern for reaction products of NZP-type material with CMAS in accordance with an embodiment of the invention.
Figure 5:
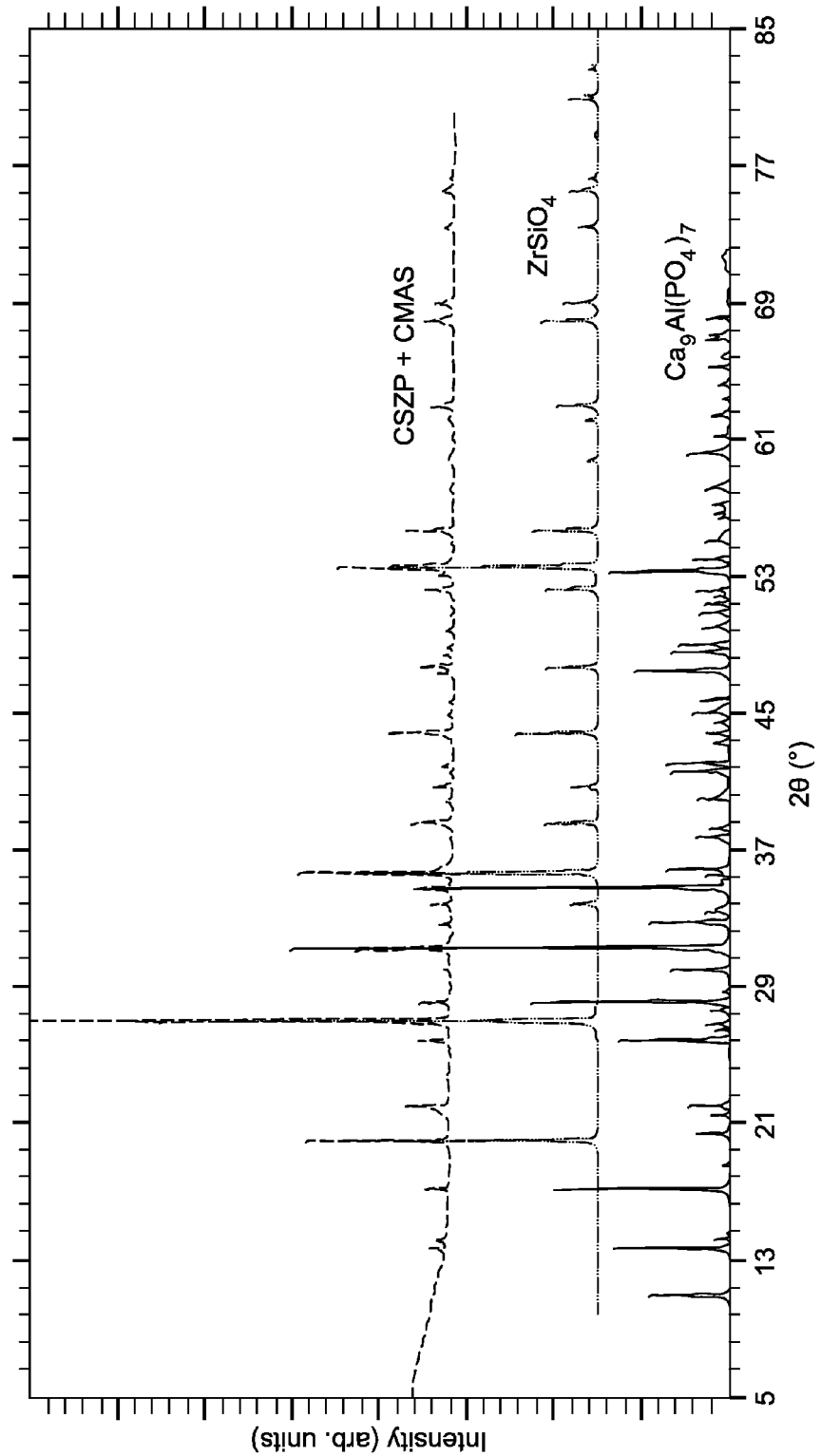
FIG. 5 shows the powder X-ray diffraction pattern for reaction products of NZP-type material with CMAS in accordance with an embodiment of the invention.
Figure 6:
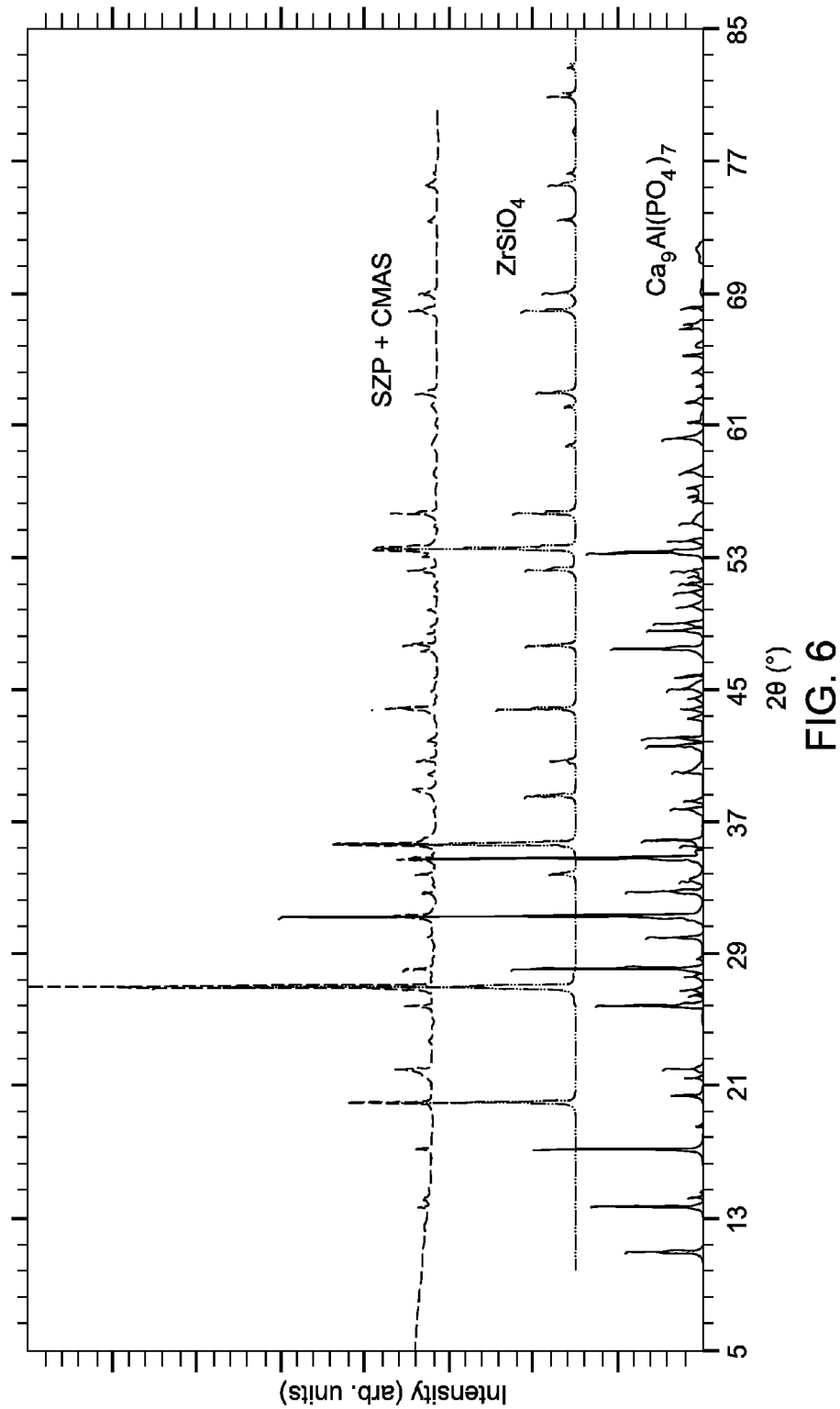
FIG. 6 shows the powder X-ray diffraction pattern for reaction products of NZP-type material with CMAS in accordance with an embodiment of the invention.

The three different NZP-type materials (as pellets) were contacted with CMAS composition at 1400° C. for 15 minutes. The weight ratio of NZP-type material to the CMAS composition was 1:1. All the three NZP-type materials reacted completely with CMAS forming $ZrSiO_4$ and $Ca_9Al(PO_4)_7$ as major type of phases. FIGS. 4-6 show the PXRD patterns for reaction products of CZP, CSZP and SZP with CMAS, along with reference patterns for $ZrSiO_4$ and $Ca_9Al(PO_4)_7$.

Comparative Example 1 Reaction of CMAS with Phosphates

Figure 7:
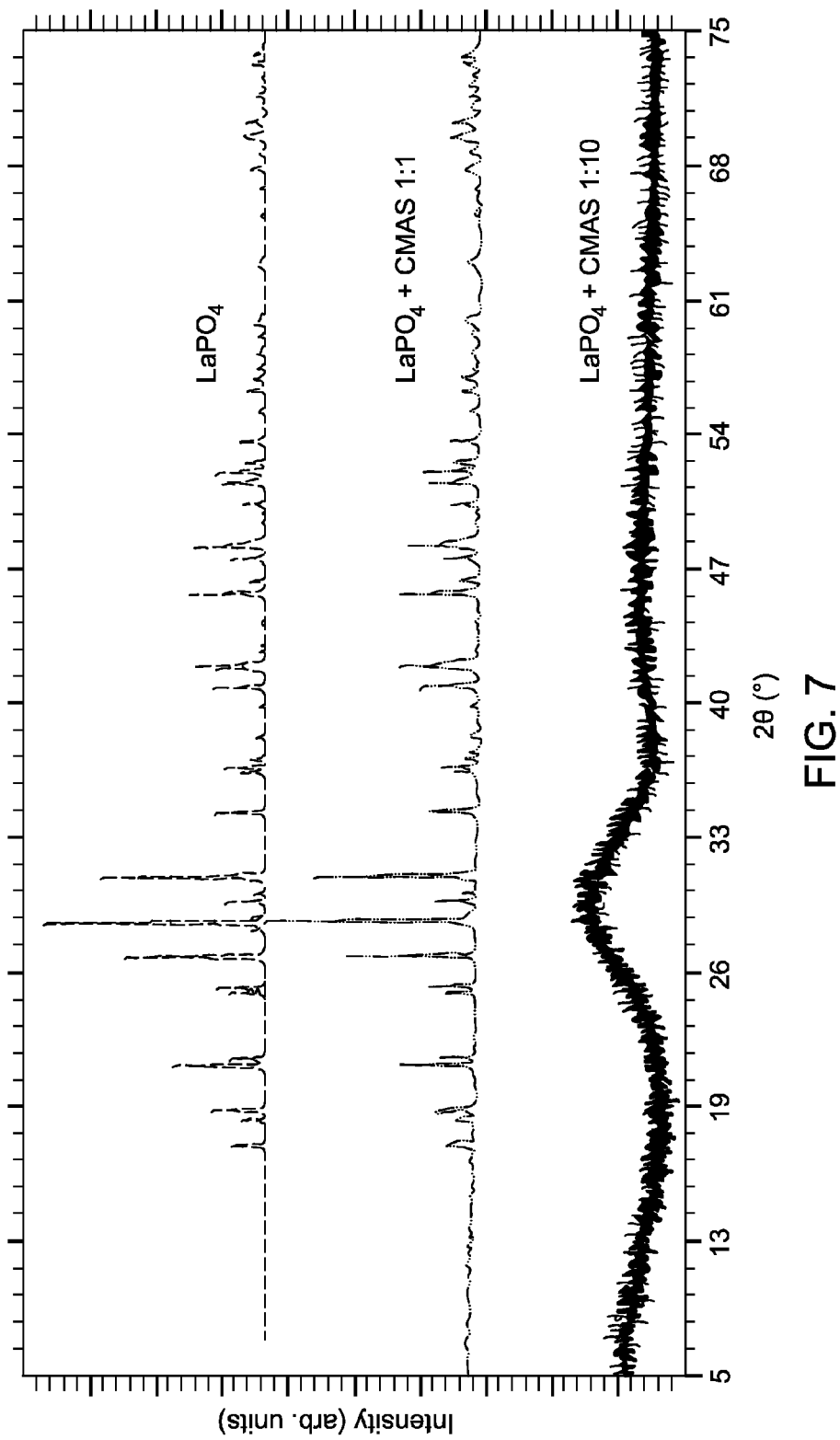
FIG. 7 shows the powder X-ray diffraction pattern for reaction products of a phosphate with CMAS in accordance with a comparative example.
Figure 8:
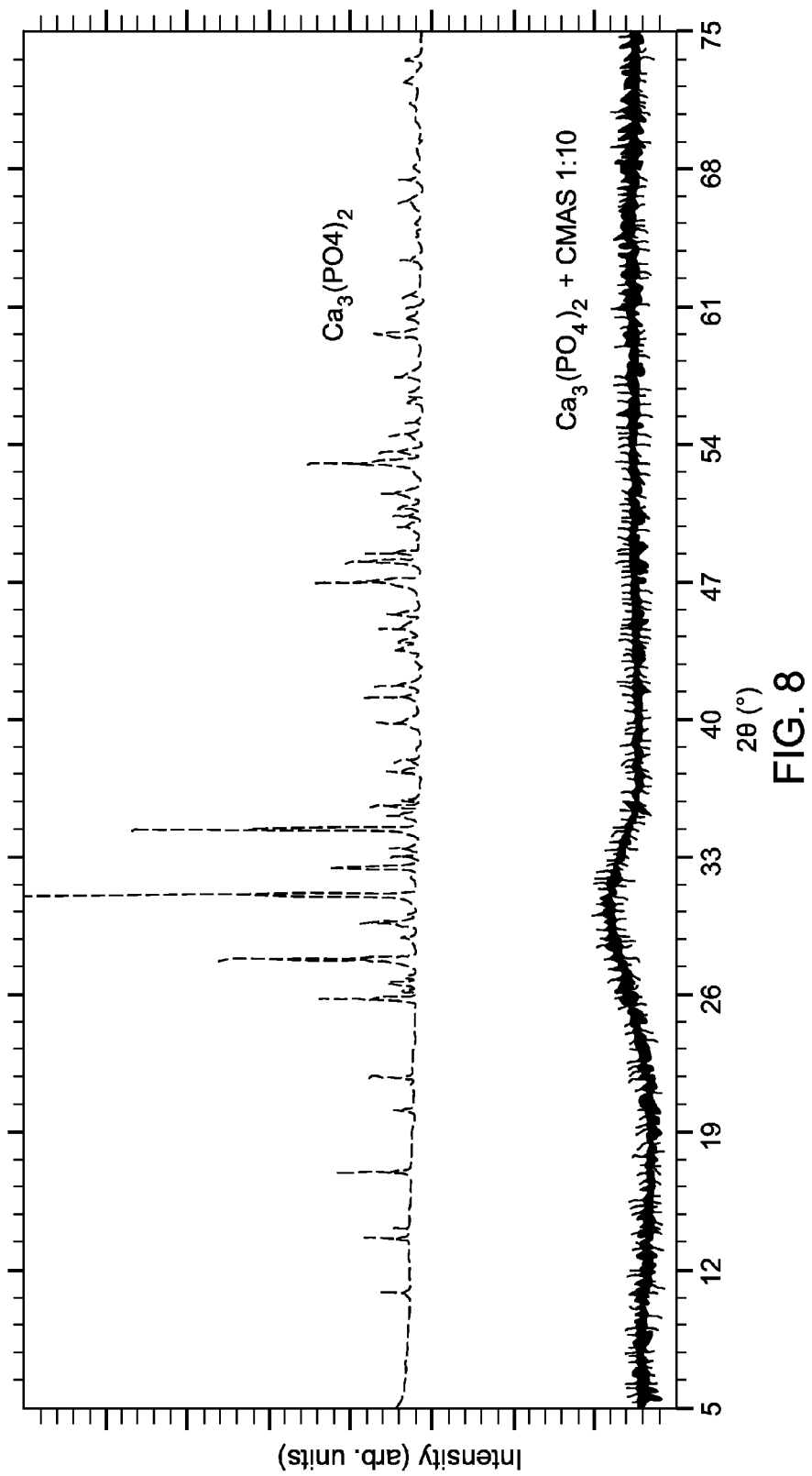
FIG. 8 shows the powder X-ray diffraction pattern for reaction products of a phosphate with CMAS in accordance with a comparative example.
Figure 9:
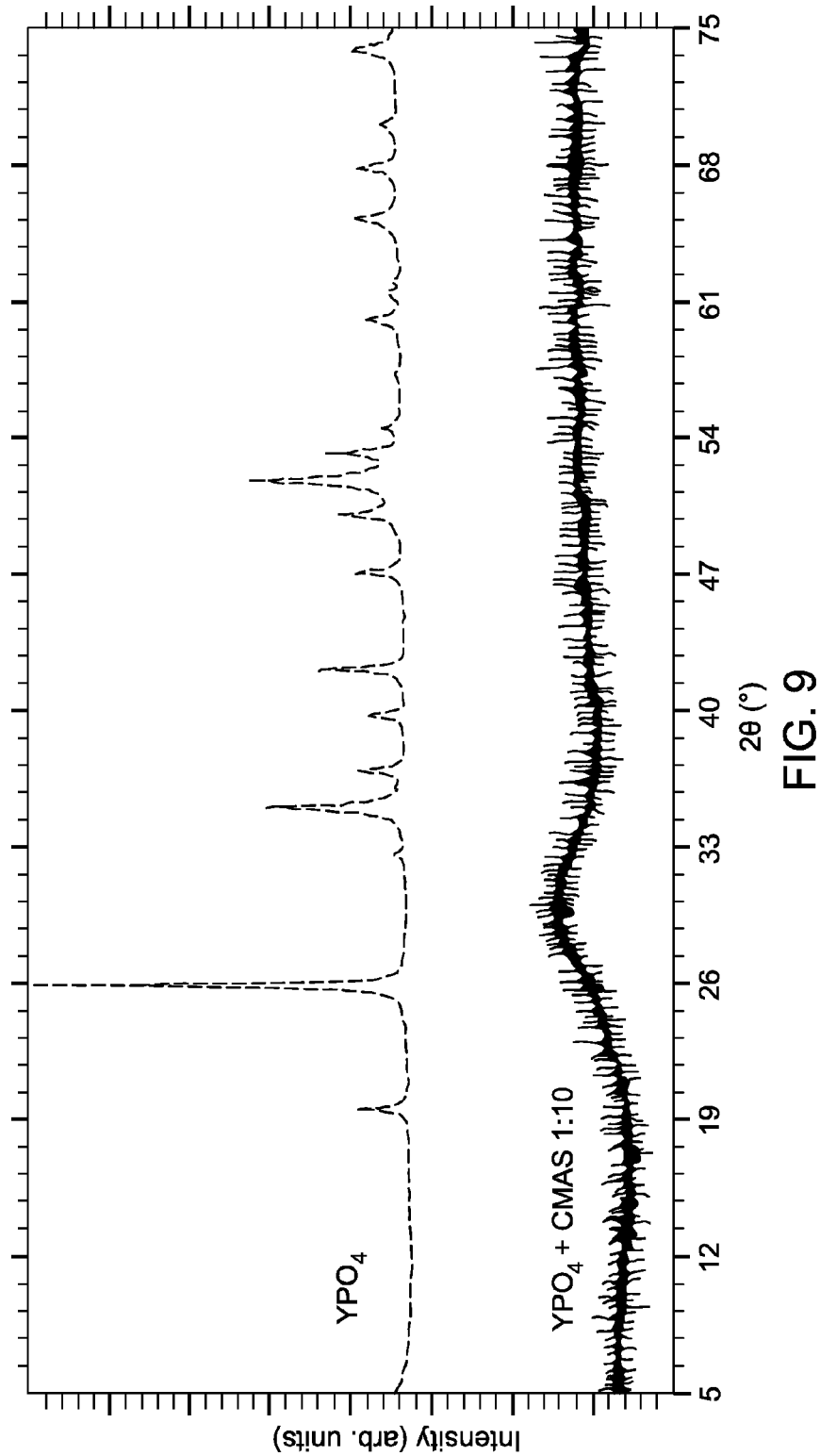
FIG. 9 shows the powder X-ray diffraction pattern for reaction products of a phosphate with CMAS in accordance with a comparative example.

Three different phosphates: lanthanum phosphate ($LaPO_4$), calcium phosphate ($Ca_3(PO_4)_2$), and yttrium phosphate ($YPO_4$) (as pellets) were contacted with the CMAS composition at 1400° C. for 15 minutes. The weight ratio of phosphates to the CMAS composition was either 1:1 or 1:10. All the three phosphates dissolved into the CMAS composition forming glass (even at high CMAS concentrations of 1:10). FIGS. 7-9 show the PXRD patterns for reaction products of $LaPO_4$, $Ca_3(PO_4)_2$, and $YPO_4$ with CMAS, along with reference patterns for the starting phosphate materials.

The present invention has been described in terms of some specific embodiments. They are intended for illustration only, and should not be construed as being limiting in any way. Thus, it should be understood that modifications can be made thereto, which are within the scope of the invention and the appended claims. Furthermore, all of the patents, patent applications, articles, and texts which are mentioned above are incorporated herein by reference.

The invention claimed is:

1. An article, comprising:
a substrate comprising a superalloy of nickel, cobalt, or combinations thereof;
a plurality of coatings disposed on the substrate, the plurality of coatings comprising:
a thermal barrier coating disposed on the substrate, wherein the thermal barrier coating comprises a ceramic thermal barrier material selected from the group consisting of zirconias, pyrochlores, and combinations thereof, wherein the ceramic thermal barrier material is present in the thermal barrier coating in a range from about 95 weight percent to about 100 weight percent,
a bond coating disposed between the substrate and the thermal barrier coating, wherein the bond coating comprises a metal aluminide or a $M_1CrAlY$ alloy, where $M_1$ is iron, nickel, platinum, or cobalt; and
a protective coating of a calcium-magnesium-aluminum-silicon-oxide (CMAS)-reactive material disposed on the thermal barrier coating, the CMAS-reactive material present in the protective coating in an amount of about 100 weight percent, the CMAS-reactive material is $A_{1-x}B_xZr_{4-y}D_y(PO_4)_z$, wherein A and B are selected from the group consisting of alkaline earth metals and rare earth metals, D is hafnium or titanium and x is a number from 0 to 1; y is a number from 0 to 4; and z is 3 or 6,
wherein the CMAS-reactive material is present in the plurality of coatings in an effective amount to react with a CMAS composition at an operating temperature of the thermal barrier coating, thereby forming a reaction product having one or both of melting temperature and viscosity greater than that of the CMAS composition.

2. The article of claim 1, wherein the CMAS-reactive material comprises $MZr_4(PO_4)_6$, wherein M comprises at least one alkaline earth metal.

3. The article of claim 1, wherein the CMAS-reactive material comprises $Ca_xSr_{1-x}Zr_4(PO_4)_6$, wherein x is a number from 0 to 1.

4. The article of claim 1, wherein the CMAS-reactive material comprises $CaZr_4(PO_4)_6$, $SrZr_4(PO_4)_6$, Ca0.5Sr0.5Zr4(PO4)$_6$, or combinations thereof.

5. The article of claim 1, wherein the protective coating has a thickness in a range from about 25 microns to about 1000 microns.

6. The article of claim 1, wherein the ceramic thermal barrier material comprises yttria-stabilized zirconia, scandia-stabilized zirconia, calcia-stabilized zirconia, magnesia-stabilized zirconia, or combinations thereof.

7. A turbine engine component comprising the article of claim 1.

8. The turbine engine component of claim 7, wherein the article is a combustor component, a turbine blade, a shroud, a nozzle, a heat shield, or a vane.

9. The article of claim 1, wherein the ceramic thermal barrier material comprises a pyrochlore of general formula $A_2B_2O_7$, wherein A comprises gadolinium, cerium, lanthanum, yttrium, or combinations thereof and B comprises hafnium, titanium, zirconium, or combinations thereof.

10. The article of claim 1, wherein the substrate comprises a nickel-based superalloy.

11. A turbine engine component, comprising:
a plurality of coatings disposed on a superalloy substrate comprising nickel, cobalt, or combinations thereof, the plurality of coatings comprising:
a thermal barrier coating disposed on the superalloy substrate, wherein the thermal barrier coating comprises a ceramic thermal barrier coating material in a range from about 95 weight percent to about 100 weight percent, and wherein the ceramic thermal barrier coating material comprises yttria stabilized zirconia;
a bond coating disposed between the substrate and the thermal barrier coating, wherein the bond coating comprises a metal aluminide or a M1CrAlY alloy, where M1 is iron, nickel, platinum, or cobalt; and
a protective coating of a calcium-magnesium-aluminum-silicon-oxide (CMAS)-reactive material disposed on the thermal barrier coating, the CMAS-reactive material present in the protective coating in an amount of about 100 weight percent, the CMAS-reactive material is $Ca_xSr_{1-x}Zr_4(PO_4)_6$, wherein x is a number from 0 to 1, and
wherein the CMAS-reactive material is present in the plurality of coatings in an effective amount to react with a CMAS composition at an operating temperature of the thermal barrier coating, thereby forming a reaction product having one or both of melting temperature and viscosity greater than that of the CMAS composition.

12. An article, comprising:
a substrate comprising a superalloy;
a plurality of coatings disposed on the substrate, the plurality of coatings comprising:
a thermal barrier coating disposed on the substrate, wherein the thermal barrier coating comprises a stabilized zirconia, and wherein the stabilized zirconia is present in the thermal barrier coating in a range from about 95 weight percent to about 100 weight percent,
a bond coating disposed between the substrate and the thermal barrier coating, wherein the bond coating comprises a metal aluminide or a M1CrAlY alloy, where M1 is iron, nickel, platinum, or cobalt; and
a protective coating of a calcium-magnesium-aluminum-silicon-oxide (CMAS)-reactive material disposed on the thermal barrier coating, the CMAS-reactive material present in the protective coating in an amount of about 100 weight percent, the CMAS-reactive material is $Ca_xSr_{1-x}Zr_4(PO_4)_6$, wherein x is a number from 0 to 1.

* * * * *